METHODS OF PRODUCING SINGLE CRYSTALS ON SUPPORTING SUBSTRATES

Filed Oct. 18, 1968

INVENTORS
RUPERT F. ROSS
GUENTER H. SCHWUTTKE
JAMES K. HOWARD

BY Wolmar J. Stoffel
ATTORNEY

United States Patent Office 3,585,088

Patented June 15, 1971

3,585,088

METHODS OF PRODUCING SINGLE CRYSTALS ON SUPPORTING SUBSTRATES

Guenter H. Schwuttke, Poughkeepsie, and James K. Howard, Fishkill, N.Y., and Rupert F. Ross, Boulder, Colo., assignors to International Business Machines Corporation, Armonk, N.Y.

Filed Oct. 18, 1968, Ser. No. 768,664

Int. Cl. H01l 7/36, 7/38, 7/54

U.S. Cl. 148—174 10 Claims

ABSTRACT OF THE DISCLOSURE

A method of producing oriented crystal overgrowth on a monocrystalline or amorphous substrate wherein a film of crystalline material is deposited on the substrate and regions of the film are selectively bombarded with a laser beam pulse.

BACKGROUND OF THE INVENTION

The invention herein described was made in the course or under a contract or subcontract thereunder with the United States Air Force.

The present invention relates to a method for producing thin film crystals and, more specifically to a method for recrystallizing thin films of polycrystalline material supported on a substrate.

It is conventional in the fabrication of semiconductor devices, particularly integrated circuit semiconductor devices, to form and isolate active and passive devices in a monocrystalline wafer of semiconductor material. The starting monocrystalline wafers are made by growing an elongated single crystal ingot, slicing it into a plurality of sections, and then lapping and polishing these sections. Typically, the fabrication operations necessary to form the devices on the wafers include epitaxial deposition, surface masking, selective etching, selective diffusion, surface oxidation and passivation, and the application of suitable terminals.

The formation of monocrystalline wafers is relatively time consuming and costly requires special equipment, and is wasteful of semiconductor material. Further, the known methods of diffusion and isolation involve many batch type operations which are not conducive to automation. In order to reduce the cost of integrated circuit solid state devices, new techniques are desirable to permit the forming of monocrystalline regions on supporting substrates, preferably insulating material.

Efforts have been made to eliminate the conventional starting wafer in the manufacture of solid state devices. To that end, various processes have been tried for the direct production of single crystals of semiconductor materials in the form of substantially flat thin bodies on a suitable substrate of a material such as glass or graphite. These processes have usually involved the thermal decomposition or reduction of a compound, containing the desired semiconductor material, to deposit the material in a monocrystalline state on the substrate. Some of these procedures have required the use of activating material such as silver or aluminum to promote crystal growth or nucleation of the semiconductor material in subsequent heating steps. These prior procedures and the necessary apparatus for carrying them out have been more complex than is desired for many applications, or have not been capable of growing single semiconductor crystals of significant size and quality to facilitate the convenient fabrication of semiconductor devices therefrom.

It is well-known that single film crystals can be produced by epitaxial growth. However, the prime requisite for such growth is that it occur on a monocrystalline substrate of the same material or possibly another monocrystalline material having basically the same crystalline lattice structure.

Methods have been proposed for growing single thin film crystals on monocrystalline or amorphous substrates. It is known to deposit a film of crystalline material having a random microcrystalline structure upon amorphous substrate, thereafter selecting a crystallite from the film of the desired orientation as the seed from which a single crystal film will be grown, centering the selected crystallite within the source of heat, and adjusting the intensity of the source of heat to provide an annular melting of the film about the selected crystallite. A preferable heat source is an electron beam apparatus. Another method of producing single crystals is disclosed and claimed in U.S. Pat. 3,335,038. In this method a thin film of crystalline material is vapor deposited on a substrate of polycrystalline material. The resultant substrate is then heated to a temperature above the melting of the film for a time sufficient to melt the film, and thereafter cooling the film to a temperature 20–100° C. below the melting point thereby allowing the film to solidify. Upon cooling the film crystallizes to form groups of large thin homogeneous single crystals.

In the aforedescribed methods the choice of substrate material is limited since the substrate must have a melting point higher than the melting point of the film to be melted. Further, since there is an actual melting of the film, there is the possibility of backdoping from the substrate depending on the material thereof. Still further, with the last mentioned method the localizing of the crystal structure is not possible.

SUMMARY OF THE INVENTION

It is an object of this invention to provide a technique for producing oriented crystal overgrowth.

Another object of this invention is to provide a new method for producing large monocrystals in a crystalline film supported on a substrate.

Still another object of this invention is to provide a new method for the growth of thin film single crystals on amorphous or polycrystalline substrates.

Still another object of this invention is to provide a new method for producing oriented crystal overgrowth within a crystalline film without the physical remelting of the film.

Another object of this invention is to provide a novel semiconductor device consisting of an oriented crystal overgrowth supported on a substrate produced by recrystallizing a film of crystalline material with a laser beam.

In accordance with this invention, a film of crystalline material is deposited upon a suitable substrate, preferably an amorphous or a polycrystalline substrate. At least portions of the film are irradiated with a laser beam pulse having an intensity sufficient to re-orient the crystal lattice of the film. Preferably the intensity is adjusted so as not to cause remelting of the film.

The new method of the invention solves many of the problems associated with methods known to the prior art for achieving the formation of monocrystals, particularly crystal overgrowth. In the subject method the monocrystalline regions can be confined to localized areas thus utilizing the surrounding amorphous or polycrystalline film as insulation. Further, by selecting a substrate which is relatively transparent to the laser beam, materials for the supporting substrate can be utilized which have a melting point significantly below the melting point of the crystalline film. Still further, since re-orienting of the crystal lattice can be achieved without actual melting of the film, backdoping of the crystallized area by the substrate is minimized or virtually eliminated. The method is further adaptable to automation which when developed could result in a significant cost reduction of semiconductor devices.

A BRIEF DESCRIPTION OF THE DRAWING

The foregoing and other objects, features, advantages of the invention will be apparent from thhe following more particular description of preferred embodiments of the invention as illustrated in the accompanying drawings.

In the drawings; FIGS. 1 and 2 are elevational views in cross-section representing stages in the forming of thin homogeneous monocrystal regions of a first material as a thin film on a substrate of a second material.

DESCRIPTION OF THE PREFERRED EMBODIMENTS

Figure 1:
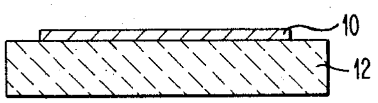

Referring now to FIG. 1 of the drawings, a thin film 10 of an amorphous or polycrystalline material is shown deposited on a substrate 12 of insulating material. The material of film 10 can be any suitable material typically metals or semiconductor materials. Typical metals contemplated to be deposited by the method of the invention include aluminum, copper and tungsten, etc. Typical semiconductor materials include silicon germanium, gallium arsenide, indium, antimony, cadmium sulphide, etc. However, any suitable crystalline material can be recrystallized by the method of the invention.

The desirability of obtaining monocrystalline semiconductor material in the fabrication of integrated circuit devices and of other electronic devices is well-known. In regard to the reforming of crystals in metallic films, it has been noted that large grain structures reduce the electromigration phenomena. Thus, it may be desirable in the manufacture of integrated circuit devices to recrystallize the metal stripes in the metallurgy particularly in the regions prone to failure by the electromigration problem to recrystallize the film.

The film 10 of amorphous or polycrystalline material can be deposited on the substrate 12 by any suitable method. Typically the deposition can be done by sputtering, vapor deposition techniques, thermal decomposition, etc. In regard to semiconductor films, in particular silicon film, it may be deposited by any of several well-known techniques such as thermal reduction at an elevated temperature of trichlorosilane ($SiHCl_3$), or silicon tetrachloride ($SiCl_4$) with hydrogen gas, the pyrolytic composition of a silane ($SiH_4$) or a halide such as silicon tetraiodide ($SiI_4$) or a disproportionating reaction of a silicon dihalide. Such operations are well-known in the semiconductor art so that they do not need explanation. However, a process which is in common use will be mentioned briefly. A mixture of triclorosilane vapor mixed with hydrogen as the carrier gas is swept over the surface of substrate 12 maintaining it at a high temperature in a reaction chamber (not shown). The vapor decomposes leaving a deposit of silicon ions which are sufficiently mobile at the temperature involved to find equilibrium lattice positions on the substrate 12. These atoms collectively form the film 10. Since the substrate 12 is a polycrystalline or amorphous material, the silicon film 10 will also be polycrystalline or amorphous and will have a grain size substantially the same or lower as that of the substrate. If desired, the semiconductor film 10 can include minute quantities of a dopant material either P or N type. This dopant can, if desired, be embodied in the film during the deposition thereof.

The film 10 can be of any suitable thickness. When the film is of a metallic material the thickness is preferably on the order of a micron. However, if the film 10 is of a semiconductor material, the thickness is preferably between 1 and 10 microns. As will be later explained, the thickness of the film 10 directly affects the techniques of recrystallization.

The substrate 12 can be of any suitable insulating material and preferably has a melting point above the melting point of the thin film 10. Typically the materials used in substrate 12 are aluminum oxide, silicon dioxide, silicon nitride, silicon carbide, diamond, ruby, etc. Still further, it would be desirable that the material of the substrate not be of the type to produce a doping action of the film at higher temperatures. The surface of the substrate 12 on which the film 10 is deposited is normally polished to obtain a near perfect surface. Preferably the surface is chemically polished to remove damaged portions of the surface which normally occur when polishing is done mechanically.

Figure 2:
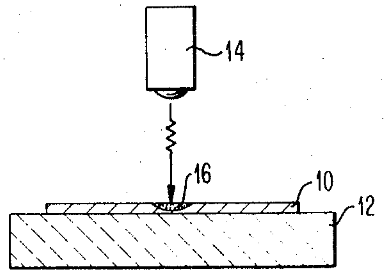

The next step in the formation of monocrystalline films is depicted in FIG. 2. A portion of film 10 is bombarded or irradiated with a pulsed laser beam 14. When the film 10 is bombarded with a laser beam pulse a crystallization occurs which is believed due primarily to the energy of the lattice vibration. When the energy of the laser beam 14 is adjusted properly the crystallization will occur without any vaporization of the film 10. The exact mechanism for recrystallization is not understood but it is believed that energy is dissipated as a shock wave which causes an instant recrystallization of the film in the region being bombarded.

The wavelength of the laser beam 14 is preferably chosen so that the energy from the beam is absorbed by the film but not materially absorbed by the substrate 12. However, there is some inherent heating of the film and subsequent heating of the substrate by conduction. Thus, it is preferable that the material of the substrate be capable of withstanding moderately high temperatures, preferably up to 600° C. without any doping effect on the film 10. If the energy of the beam is too high the film 10 will be melted or in more extreme cases evaporated. This is undesirable.

When the thickness of the film 10 exceeds a certain limit the film will be melted or evaporated since the major portion of the radiant energy is absorbed by the top portion of the film without heating the lower portion. Under ideal conditions the area of the film 10 bombarded by the laser pulse will be recrystallized and the excess energy radiated on through the substrate 12.

Figure 3:
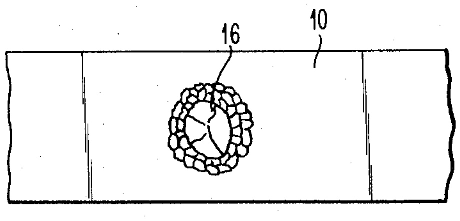
FIG. 3 is a top plan view of the film shown in FIG. 2 illustrating the monocrystalline structure resulting from practicing the method of the invention.

A typical laser useful for practicing the method of the invention is a ruby laser having a wave length of 6,280 A. with an energy of less than one joule per pulse. In order to achieve the desired energy intensity in the film the beam can be focused, defocused, passed through a filter, or masked to control the energy level. FIG. 3 depicts a top view of the resultant monocrystal produced by the technique shown in FIGS. 1 and 2. As indicated, the irradiated region of film 10 displays a monocrystalline, or a series of monocrystals which can be described as oriented crystal overgrowth. The film 10 of polycrystalline or amorphous material with recrystallized regions is illustrated with greatly enlarged grain structure in FIG. 3 for purposes of clarity.

In general each material has a preferred growth direction. For example, on a smooth substrate a thin layer of silicon will recrystallize in the 111 plane as defined by the Miller indices. Thus, under properly controlled conditions on a smooth substrate monocrystals produced by a laser beam pulse will have the same general crystal orientation. The substrate and the surrounding polycrystalline portion of film 10 serves as an effective insulating support for the crystalline region.

Figure 4:
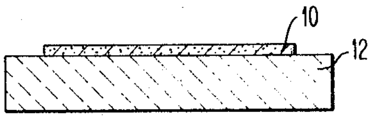
FIGS. 4, 5, 6 and 7 are elevational views in cross-section depicting a series of stages in a preferred specific embodiment of the invention for producing doped monocrystalline thin film of semiconductor material on a substrate.
Figure 5:
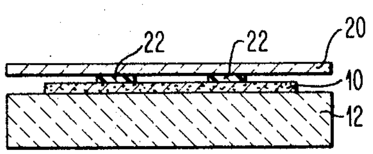

Referring now to FIGS. 4, 5, 6 and 7, still another embodiment of the method of the invention is illustrated. In FIG. 4, there is depicted a coating 10 of polycrystalline or amorphous material deposited on a substrate 12. The film 10 and substrate 12 are prepared in the same manner as described previously in relation to FIG. 1. This embodiment of the method of the invention results in doped monocrystalline regions in the thin film. As shown in FIG. 5, a glass plate 20 having deposited thereon very thin regions of dopant 22, is positioned in overlying relationship to film 10 with the dopant in direct contact therewith. The dopant 22 can be of any suitable type either P or N deposited by any conventional method. If desired, the entire surface of plate 20 can be coated with the dopant instead of the regions as shown in FIG. 5.

Figure 6:
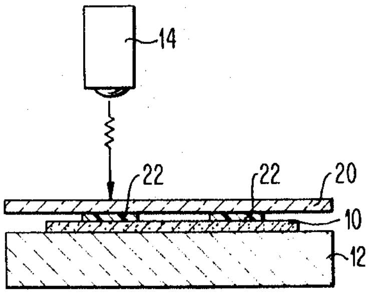
Figure 7:
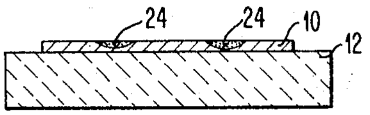

As shown in FIG. 6 the resultant assembly depicted in FIG. 5 is then irradiated with a pulse from laser 14. The laser beam is directed on the localized film 22 of dopant. The resultant product is shown in FIG. 7 consisting of doped monocrystalline regions 24 in film 10.

In carrying out the specific embodiment of the method described in FIGS. 4 through 7 the glass plate or other suitable backing is selected of a material which will not appreciably absorb the energy from laser 14. Likewise, the coating of dopant 22 should be relatively thin so as not to absorb an appreciable amount of energy from the laser 14. The energy of the laser pulse emanating from laser 14 is preferably adjusted so that there will be no melting or vaporization of film 10 during the recrystallization operation. The energy of the pulse can be adjusted by varying the duration of the pulse, focusing, masking, etc. In general the energy will be less than one joule.

Figure 8:
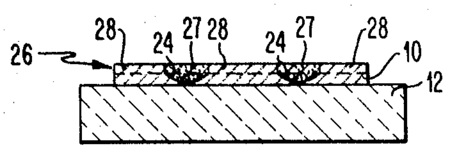
FIG. 8 is an elevational view in cross-section illustrating deposition of an epitaxial layer on a re-crystallized and doped region.

The devices resulting from the invention can be utilized in any suitable manner. For example, if the monocrystalline film 10 is of semiconductor material a subsequent smaller diffusion can be made in the initial monocrystalline region either by conventional diffusion processes or by the process of diffusion with a laser beam described in commonly assigned patent application Ser. No. 704,058 entitled Method for Making Semiconductor Junction Devices. Alternately, as indicated in FIG. 8, a layer 26 of semiconductor material can be deposited on the surface of the monocrystalline regions. The portions 27 of film 26 over monocrystalline regions 24 will be epitaxial in nature, having a generally monocrystalline lattice structure similar to regions 24. The remaining portions 28 of film 26 will be polycrystalline or amorphous. Diffusions can be made in the resultant regions 27 of film 26 to form semiconductor devices. Such devices are electrically isolated from each other by the underlying substrate 12 and amorphous or polycrystalline partitions of films 10 and 26. The initially formed regions in film 10 can be doped at a higher concentration than the epitaxial layer and these regions used as a buried subcollector if desired. After the epitaxial layer has been deposited and the various regions diffused to form the device, suitable metallurgy can be deposited by techniques well-known in the art.

The following examples illustrate preferred specific embodiments of the method of the invention.

EXAMPLE I

A film of aluminum having a thickness of 3000 A. was deposited on an $SiO_2$ coated silicon wafer in an evaporation apparatus. After evaporation a dumbbell shaped test pattern was formed by subtractively etching the aluminum film. The stripe dimensions were 0.5 by 0.025 inch. The sample was then positioned so that the center of the stripe was the target of a Lier-Siegler LW–212 pulsed ruby (6943 A.) laser. The film at room temperature was then irradiated with the laser set at the lowest setting, namely 5–100 which resulted in an energy output of approximately 0.01 joule. The pulse was set at 2.2 milliseconds. After irradiation, the sample was visually inspected. It was noted that a local melting and evaporation of the film occurred in the irradiated area. The irradiated area encompassed a circle having an approximate diameter of 50 microns. The power per unit area was $5.1\times10^2$ joules per $cm.^2$. It was concluded that for the thickness of the film the energy in the irradiated area was set at too high a level to effectively produce grain growth. It was concluded that the relatively thin film did not provide sufficient dissipation of the heat at the level of irradiation.

EXAMPLE II

An aluminum film having a thickness of 5000 A. was evaporated on a silicon substrate having an overlying $SiO_2$ layer as described in Example I. A dumbbell shaped pattern was etched in the film and the sample positioned so that the center of the stripe was the target of the aforementioned laser apparatus. The object of the test was to determine the operative energy level range of the laser apparatus with a film of 5000 A. Accordingly, the film was irradiated repeatedly at different areas of the film and the energy level varied from 0.01 joule to 0.035 joule in increments of 0.005 joule. This corresponds to a power per unit area range of $5.1\times10^2$ to $1.8\times10^3$ joules per $cm.^2$. After each irradiation the sample was visually observed to detect evidence of melting or evaporation. At an irradiation level of 0.035 joule melting first occurred. At all previous irradiations no melting was observed. Thus, it was determined that the operable energy level for the laser for irradiating an aluminum film with a thickness of 5000 A. was from 0.1 to 0.025 joule. This corresponds to a power per unit area range of $5.1\times10^2$ to $1.28\times10^3$ joules per $cm.^2$.

EXAMPLE III

An aluminum film having a thickness of 5000 A. was again deposited on an $SiO_2$ coated silicon wafer and a dumbbell pattern etched therein. The sample was positioned so that the center of the stripe was the target of the apparatus and irradiated with the output energy of the laser beam set at 0.025 joule. The irradiated area was measured and found to be a circular area having a 50 micron diameter. Transmission electron microscopy of the sample revealed that the average matrix gain size in the irradiated area was from 10 to 20 microns. In contrast the average grain size in the area surrounding the irradiated area had a grain size of 1 micron. The point of prime interest was the rapid change in grain size from small to very large grains.

Subsequently aluminum pressure contacts were employed to achieve electrical connection to the sample. A constant current voltage limited D.C. power supply was used to obtain a maximum current density of $0.6\times10^6$ amps per centimeter in the stripe. The stripe was maintained at a constant ambient temperature at 150 degrees C. Testing indicated that the irradiated areas of the film displayed a much larger resistance to electromigration under electrical stress than the unirradiated areas.

EXAMPLE IV

An amorphous film of silicon of a thickness of one micron was deposited on a crystal silicon substrate by sputter techniques. The amorphous silicon film was then coated with a thin phosphorus film having a thickness of approximately 2000 A. The resultant sample was then located in a Lier-Siegler LW–212 ruby laser for irradiation. The film was irradiated a number of times at different locations and at different energy levels which ranged from two to thirty milijoules. After the irradiation the sample was visually inspected in the irradiated regions. Where the energy range was of the order of two to five joules, diodes had formed. This illustrated that crystallization of the amorphous silicon film had clearly taken place.

While the invention has been particularly shown and described with reference to preferred specific embodiments thereof, it will be understood by those skilled in the art that various changes in form and detail may be made therein without departing from the spirit and scope of the invention.

We claim:

1. A method of producing thin film monocrystalline regions supported on a substrate comprising depositing a film of crystallizable material on a substrate, irradiating selected portions of the film to a pulsed laser beam of sufficient intensity to cause a re-forming of the micro crystals of the crystallizable material with substantially no remelting of the crystals, thereby resulting in the formation of thin large monocrystals.

2. The method of claim 1 wherein the deposited film prior to irradiation by the laser beam is a layer of polycrystalline semiconductor material.

3. The method of claim 2 wherein said film is deposited at that thickness in the range of 1 to 10 microns.

4. The method of claim 1 wherein the deposited film prior to irradiation by the laser beam is a layer of metal.

5. The method of claim 2 wherein a semiconductor dopant is placed in intimate contact with said film prior to irradiation, said dopant selected from the group consisting of Group III elements, compounds of Group III elements, Group IV elements, and compounds of Group V elements, and mixtures thereof, and irradiating the film and dopant to produce a recrystallization and diffusion, resulting in a doped monocrystalline layer.

6. The method of claim 2 wherein an epitaxial layer of semiconductor material is deposited over the irradiated regions of the film.

7. The method of claim 4 wherein said deposited film is aluminum.

8. The method of claim 7 wherein said aluminum film is deposited to form thickness of 5000 A.

9. The method of claim 8 wherein the irradiating energy of the laser beam is in the range of $5.1\times10^2$ to $1.28\times10^3$ joules per cm.$^2$.

10. The method of claim 2 wherein said deposited semiconductor film is silicon having a thickness in the range of 1 to 10 microns.

References Cited

UNITED STATES PATENTS

| | | | |
|---|---|---|---|
| 3,335,038 | 8/1967 | Doo | 148—1.6 |
| 3,336,159 | 8/1967 | Liebson | 117—201 |
| 3,420,719 | 1/1969 | Potts | 148—1.5 |

L. DEWAYNE RUTLEDGE, Primary Examiner

R. A. LESTER, Assistant Examiner

U.S. Cl. X.R.

117—201, 211, 212, 227; 148—1.5, 1.6, 175